United States Patent
Tada

(10) Patent No.: US 8,519,504 B2
(45) Date of Patent: Aug. 27, 2013

(54) ELECTRODE FOR SEMICONDUCTOR CHIP AND SEMICONDUCTOR CHIP WITH THE ELECTRODE

(75) Inventor: Kentaro Tada, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 313 days.

(21) Appl. No.: 12/453,238

(22) Filed: May 4, 2009

(65) Prior Publication Data

US 2009/0302470 A1  Dec. 10, 2009

(30) Foreign Application Priority Data

Jun. 9, 2008 (JP) .................................. 2008-150470
Apr. 23, 2009 (JP) .................................. 2009-104732

(51) Int. Cl.
*H01L 31/06* (2012.01)

(52) U.S. Cl.
USPC .................... 257/461; 257/745; 257/E21.172; 257/E29.144

(58) Field of Classification Search
USPC .......................... 257/461, 745; 438/237–238
See application file for complete search history.

(56) References Cited

U.S. PATENT DOCUMENTS

| | | | | |
|---|---|---|---|---|
| 3,634,931 A * | 1/1972 | Kano et al. | ..................... | 438/133 |
| 2002/0081800 A1 | 6/2002 | Morita | | |
| 2007/0051968 A1 | 3/2007 | Yamamoto et al. | | |

FOREIGN PATENT DOCUMENTS

| | | |
|---|---|---|
| JP | 9-8407 | 1/1997 |
| JP | 2000-49114 | 2/2000 |
| JP | 2005-26291 | 1/2005 |
| WO | WO 2005/002012 A1 | 1/2005 |

OTHER PUBLICATIONS

Antonova et al., "Phase diagram of the Ti-Ga system" Journal of alloys and compounds 317-318 (2001) 398-405.*
Antonova-2 et al., "Isothermal section of the Ti-Si-Ga system in the Ti-rich conrner at 1350 C" Journal of alloys and compounds 267 (1998) 167-170.*
"Interfacial reactions of Ti/n-GaN contacts at elevated temperature" Lu C. J., et al. Journal of Applied Physics, Jul. 1, 2003, vol. 94, No. 1, pp. 245-253.
Japanese Office Action dated Apr. 20, 2010, with partial English translation.
Chinese Office Action dated Mar. 21, 2012.

* cited by examiner

*Primary Examiner* — A. Sefer

(74) *Attorney, Agent, or Firm* — McGinn Intellectual Property Law Group, PLLC

(57) ABSTRACT

In an n-type semiconductor layer that contains gallium (Ga), contact resistance is to be suppressed at a low level. An n-side electrode is provided on a surface of the n-type semiconductor layer containing Ga. The electrode includes a metal layer having a Ga content of equal to or more than 1 at % and equal to or less than 25 at %. The metal layer is disposed in contact with the n-type semiconductor layer.

11 Claims, 6 Drawing Sheets

ELECTRODE FOR SEMICONDUCTOR CHIP AND SEMICONDUCTOR CHIP WITH THE ELECTRODE

This application is based on Japanese patent applications No. 2008-150470 and 2009-104732, the contents of which are incorporated hereinto by reference.

BACKGROUND

1. Technical Field

The present invention relates to an electrode for a semiconductor chip, a semiconductor chip with the electrode, and a method of manufacturing such semiconductor chip.

2. Related Art

For a so-called next-generation DVD such as a Blu-ray disk or a High-Definition Digital Versatile Disc (hereinafter, HD-DVD), laser beam of 405 nm or so in wavelength is employed for retrieving data recorded on the disk surface and writing new data thereon. For such purpose, a semiconductor laser based on a semiconductor crystal predominantly containing gallium nitride (hereinafter, GaN) is employed as the light source of the laser beam.

In a semiconductor laser of a shorter oscillation wavelength, the active layer has a wider band gap and hence a larger built-in potential, and therefore a higher voltage has to be applied for supplying a current. Also, the semiconductor laser typically has a double-hetero structure which encourages efficient reunion of electrons and holes in the active layer. Accordingly, the semiconductor laser includes a clad layer having a wider band gap than the active layer.

In a semiconductor in general, the higher the band gap is, the higher the electric resistance becomes. Therefore, normally the semiconductor laser of the shorter wavelength has the higher electric resistance in the clad layer in the same way.

Further, the semiconductor laser includes metal electrodes disposed in contact with the p-type semiconductor and the n-type semiconductor respectively. The contact resistance between the electrode and each of the semiconductors tends to be higher, in the semiconductor having the wider band gap. For such reasons, higher working voltages are required for supplying the same current, in the ascending order of the laser for a Compact Disc (hereinafter, CD) (wavelength 780 nm), for a DVD (wavelength 650 nm), and for a next-generation DVD (wavelength 405 nm).

A recording and reproducing apparatus for the next-generation DVD also includes the lasers for reading and writing in conventional media such as the CD and the DVD, in addition to the laser for the next-generation DVD such as the blue ray disk and the HD-DVD. Among those lasers, the one for the next-generation DVD requires a prominently higher working voltage, and therefore it is desirable to lower the working voltage as much as possible, to thereby employ a common power source. For this purpose, research and development of the metal electrode are persistently being made, for attaining a lower contact resistance with the p-type semiconductor layer and the n-type semiconductor layer.

Japanese Laid-open patent publication No. H09-8407 proposes a GaN-based semiconductor light emitting element in which the n-side electrode is constituted of Ti/Nb/Au layered in this order from the side of the semiconductor chip.

Also, Japanese Laid-open non-patent publication No. 2005-26291 proposes a GaN-based semiconductor light emitting element in which the n-side electrode is constituted of Pd/Mo/Au layered in this order from the side of the semiconductor chip.

The non-patent document ("Interfacial reactions of Ti/n-GaN contacts at elevated temperature", Lu C. J. et al, Journal of Applied Physics, 94, 1, (2003) pp. 245-253) provides observational data of interfacial reaction that takes place on the contact interface between Ti and the n-type GaN when heated up to 700° C. or so.

The foregoing techniques, however, still have a room for improvement in the following aspects.

Regarding the n-type GaN-based semiconductor, it is known that a relatively low contact resistance can be attained by employing a metal of a small work function such as Ti, V, or Nb as the contact electrode disposed in contact with the n-GaN layer. In the semiconductor laser, however, the contact resistance may deteriorate from the initial value owing to current supply or heating.

Moreover, Lu C. J. et al reports that heating provokes diffusion of Ga from the n-GaN layer toward the metal electrode. In the GaN a Ga defect is produced after the diffusion of Ga, and such Ga defect often acts as a p-type dopant. Accordingly, the contact resistance between the n-GaN layer and the metal electrode is increased. The increase in contact resistance due to supplying current is also partly because of the emergence of the defect originating from the Ga diffusion.

According to Lu C. J. et al, the heating also provokes diffusion of the nitrogen atom in the n-GaN layer. The N defect tends to act as an n-type dopant, and hence the contact resistance between the n-type semiconductor layer and the electrode may be expected to decrease. In practical operation of the semiconductor device, however, the contact resistance is actually prone to deteriorate because the emergence of the Ga defect or void exerts a greater effect toward increasing the resistance.

Such drawback is an issue to be resolved in common to the semiconductor chips that include the contact electrode disposed on the n-type semiconductor layer in contact therewith, without limitation to the nitride semiconductor chip including the n-GaN layer.

SUMMARY

In one embodiment, there is provided an electrode for a semiconductor chip, to be formed on a surface of an n-type semiconductor layer that contains gallium (hereinafter, Ga), comprising a metal layer having a Ga content of equal to or more than 1 at % and equal to or less than 25 at %, wherein the metal layer is disposed in contact with the n-type semiconductor layer.

In another embodiment, there is provided a semiconductor chip comprising the foregoing electrode.

In still another embodiment, there is provided a method of manufacturing a semiconductor chip, comprising preparing an n-type semiconductor layer that contains Ga, forming an n-side electrode on a surface of the n-type semiconductor layer, wherein the forming the n-side electrode includes depositing a Ga-containing metal layer on the surface of the n-type semiconductor layer, and employing a metal material having a Ga content of equal to or more than 1 at % and equal to or less than 25 at %, to thereby form the metal layer.

In the semiconductor chip thus constructed, the metal material having a Ga content of equal to or more than 1 at % and equal to or less than 25 at % is disposed in contact with the Ga-containing n-type semiconductor layer. An impurity in a semiconductor diffuses, according to the Fick's law, at a velocity proportional to the concentration gradient. In other words, atoms diffuse from a high-concentration region toward a low-concentration region in a solid. Accordingly, providing Ga in advance in the electrode allows preventing the diffusion of Ga from the semiconductor layer to the electrode. Adjusting the Ga content in the range of 1 at % to 25 at % enables properly decreasing the contact resistance of the electrode, as well as forming the metal layer having the desired Ga content under accurate control. Such arrangement enables, consequently, suppressing the deterioration in contact resistance originating from the operation of the device and thermal history.

Thus, the present invention enables attaining a low contact resistance with a Ga-containing n-type semiconductor layer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
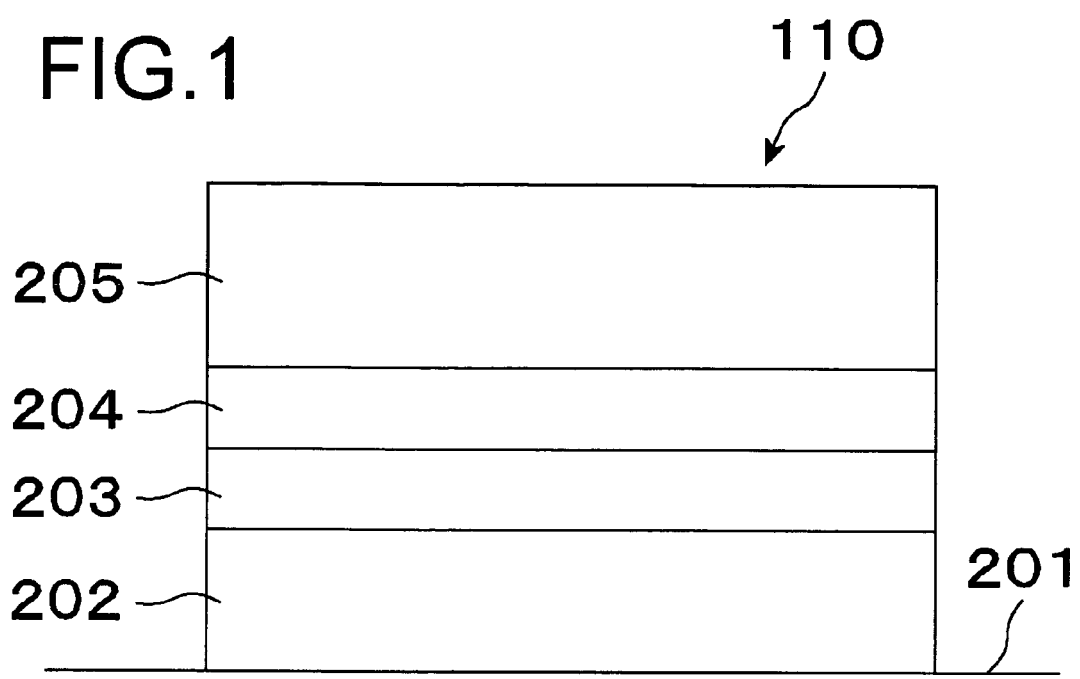
FIG. 1 is a cross-sectional view of an electrode according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, embodiments of the present invention will be described referring to the drawings. In all the drawings, same constituents are given the same numeral, and the description thereof will not be repeated.

First Embodiment

FIG. 1 is a cross-sectional view of an electrode according to this embodiment. The electrode is an n-side electrode 110 formed on a surface of an n-type semiconductor layer 201 that contains Ga. The n-side electrode 110 includes a metal layer 202 containing equal to or more than 1 at % and equal to or less than 25 at % of Ga. The metal layer 202 is located in contact with the n-type semiconductor layer 201.

To be more detailed, the n-side electrode 110 has a multi-layer structure including the metal layer 202 and a gold-plating layer 205 constituted of gold (hereinafter, Au) and formed over the metal layer 202. The gold-plating layer 205 is an uppermost layer of the multilayer structure.

Between the metal layer 202 and the gold-plating layer 205, a Pt layer 203 and a Au layer 204 are stacked in this order over the metal layer 202. Over the surface of the Au layer 204, the gold-plating layer 205 is provided.

The n-type semiconductor layer 201 may be constituted of a III-V compound such as GaN. In particular, a nitride semiconductor layer doped with an impurity such as Si or Ge, for example GaN, InGaN, or AlGaN facilitates forming a desirable ohmic contact. Above all, adopting GaN enables attaining an excellent ohmic contact.

The metal layer 202 of the n-side electrode may be constituted of a metal material containing equal to or more than 1 at % and equal to or less than 25 at % of Ga. Any metal material may be adopted provided that it is stable in the air and has a suitable melting/boiling point as an electrode. Ga content of the metal layer 202 is analyzed by using Auger Electron Spectroscopy (AES), X-ray Photoelectron Spectroscopy (XPS), Electron Probe Micro Analysis (EPMA), or the like. In these analysis methods, the element composition of the membrane surface is analyzed. Therefore, Ga content of interior position of the metal layer 202 enable to be analyzed while the metal layer 202 is etched by using sputtering method.

It is preferable to employ a material having a small work function as a host metal. In the case where the n-side electrode 110 is provided on a chip in which current runs from the p-side to the n-side, and where the metal material constituting the n-side electrode has a large work function, the contact between the n-side electrode 110 and the n-type semiconductor layer 201 forms a Schottky barrier junction, which impedes the current to run. Although the work function of the metal material may be appropriately set so as to be smaller than the electron affinity of the n-type semiconductor layer 201, it is preferable to set the work function at 5 eV or lower. A lower limit is not specifically determined, however it is preferable from a practical viewpoint that the work function is not lower than 3.0 eV.

The host metal predominantly constituting the metal material may be selected from those having a work function of 5 eV or lower, for example at least one of Ti, Nb, Al, Ta, V, and Hf. These metal materials are preferable because of the lower work function, which facilitates providing a desirable ohmic characteristic. Especially, Ti provides an excellent ohmic characteristic. The work function of the respective metals is as follows: Ti 4.4 eV, Nb 4.3 eV, Al 4.2 eV, Ta 4.3 eV, V 4.3 eV, and Hf 3.9 eV (Kochi University of Technology, Electronic and Photonic System Engineering Course, Graduate Research Report 2002, p. 4 (http://www.kochi-tech.ac.jp/library/ron/2002/2002e1e/10 30191.pdf).

In the case of adopting Ti for constituting the metal layer 202, a compound with Ga, such as $Ti_3Ga$ or $Ti_2Ga$, may be employed. The former has the smaller Ga content, which is 25 at %.

Adjusting the Ga content of the metal layer 202 to be 25 at % or lower permits presence of a region solely occupied with the host metal in the metal bulk, thereby suppressing the contact resistance at a low level. It is undesirable to compose the entirety of the metal layer 202 from the compound containing the host metal and the Ga as component elements, because the properties become substantially different. Setting the upper limit of the Ga content at 25 at % allows preventing forming the entirety of the metal layer with the compound. In the case where Ti is the host metal, it is desirable that the Ga content is adjusted so as to be 10 at % or lower through taking into consideration the crystallization performance of Ti.

Providing 1 at % or more of Ga in the metal layer 202 enables suppressing the contact resistance at a low level. The Ga content of 1 at % or more is also advantageous in processability and controllability.

Forming the metal layer 202 in a thickness of 100 Å or more facilitates effectively decreasing the contact resistance.

The Pt layer 203 serves as a barrier metal that inhibits Au from diffusing as far as the interface of the semiconductor. In the case of alloying the n-side electrode 110 at 400° C. or higher, it is preferable to form the Pt layer 203. In the case where the metal layer 202 is sufficiently thick, the Pt layer 203 may be omitted. This is because the sufficient thickness of the metal layer 202 prevents the diffusion of Au to the semiconductor interface, although the Pt layer 203 is absent.

The gold-plating layer 205 serves to enhance the wire bonding performance to the n-side electrode 110, and to alleviate a damage that the wire bonding process may impose on the n-type semiconductor layer 201.

A method of manufacturing the n-side electrode 110 according to this embodiment will now be described. To start with, the n-type semiconductor layer 201 containing Ga is prepared. The nitride semiconductor generally turns to the n-type because nitrogen voids are formed in the crystal without being doped, however doping an impurity such as Si or Ge during the growth makes a more suitable n-type nitride semiconductor. Further, the GaN-based compound semiconductor may be grown by gas phase epitaxy such as metal-organic chemical vapor deposition (MOCVD), metal-organic vapor phase epitaxy (MOVPE), or hydride vapor phase epitaxy (HVPE).

Then the n-side electrode 110 is formed on the n-type semiconductor layer 201 prepared as above. A process of depositing the metal layer 202 over the surface of the n-type semiconductor layer 201 will be described in details.

The deposition methods of the metal layer 202 include a RF sputtering process and a vapor deposition process. Each of those may be executed as follows.

(1) RF Sputtering Process

The crystal of a host metal (for example, Ti crystal) containing an appropriate amount of Ga is sintered in advance. The deposition by the RF sputtering process is performed with the metal sintered compact as a target material. In the case where the host metal is solid at room temperature, setting the Ga content at 25 at % or lower makes the sintered compact a solid at room temperature. By this method, a chemical reaction or phase shift between the chemical species barely takes place, and the target material is clusterized in vacuum by ion-etching and stacked on the sample. Accordingly, the structure of the deposited metal layer 202 becomes substantially the same as that of the target material.

(2) Vapor Deposition Process

The vapor deposition process basically includes depositing a chemical species evaporated from a source material owing to heating for the process, over the sample.

Since the phase shift over to gas takes place in the deposition process, the structure of the deposited layer becomes different from that of the source, because of the difference in the vapor pressure of the respective chemical species. Besides, employing a mixture of different metals as the source may provoke bumping, because of the difference in boiling point between the metals. Accordingly, it is preferable to adopt a co-deposition process in this embodiment.

Figure 2:
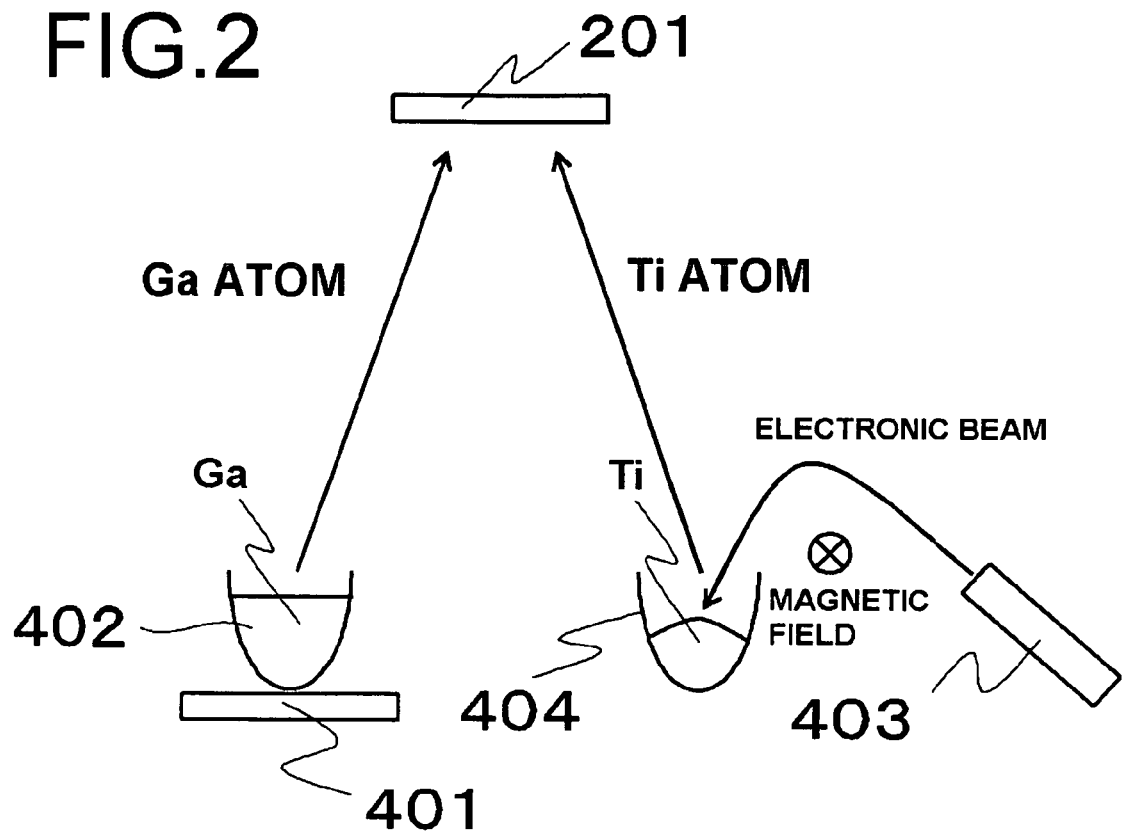
FIG. 2 is a diagram for explaining a method of manufacturing the electrode according to the first embodiment.

Specifically, as shown in FIG. 2, a melting pot 402 containing Ga and another melting port 404 containing the host metal (for example, Ti) are prepared, and a resistance heater 401 and an electronic beam 403 are employed, to evaporate Ga and Ti respectively. The evaporated Ga and Ti stick to the n-type semiconductor layer 201 and are deposited thereon, to thereby form the metal layer 202.

A reason of employing the resistance heater 401 for Ga is that Ga is liquid at room temperature. The resistance heating, which heats the entirety of the source, is generally more suitable for a liquid than the electronic beam which heats a local portion, because the former provides a more stable deposition rate. However, the electronic beam may also be employed if careful operation can be assured. Properly controlling the power of the resistance heater 401 for Ga and of the electronic beam 403 for Ti enables obtaining the metal layer 202 of a predetermined Ga content.

Over the metal layer 202 thus deposited, the Pt layer 203 and the Au layer 204 are sequentially deposited. The RF sputtering process may also be employed, for depositing the Pt layer 203 and the Au layer 204. Then the gold-plating layer 205 is formed on the Au layer 204 and an unnecessary portion is removed, for example by a milling process, so that the n-side electrode 110 is completed.

It is to be noted that the n-side electrode 110 according to this embodiment is applicable to various semiconductor chips that include an n-type semiconductor layer. Examples of such semiconductor chip include a semiconductor laser, a light emitting diode, and an electronic device.

The sample-making process of the n-side electrode 110 shown in FIG. 1 and the evaluation thereof will be described hereunder. First, an n-GaN layer was prepared as the n-type semiconductor layer 201. Then a TiGa layer was deposited over the surface of the n-GaN layer in a thickness of 300 Å, so as to serve as the metal layer 202. The deposition was carried out by a sputtering process. The content of Ga in the TiGa layer was adjusted to be 1% in atomic concentration. The content of Ga in the TiGa layer was analyzed by using XPS method. On such TiGa layer, the Pt layer 203 and the Au layer 204 were sequentially deposited, both in a thickness of 150 Å, by a RF sputtering process. The Au was plated in a thickness of 205 Å, and an unnecessary portion was removed, for example by a milling process, so that the n-side electrode 110 was completed.

The contact resistance with the n-GaN layer was evaluated through a Transmission Line Model (TLM) method. As a result, the contact resistance in the order of $10^{-5} \Omega cm^2$ was obtained. Also, after alloying at 800° C. for 15 minutes in a nitrogen atmosphere, the contact resistance in the order of $10^{-5} \Omega cm^2$ was obtained as well.

The foregoing embodiment provides the following advantageous effects. In this embodiment, the metal layer 202, constituted of the metal material containing equal to or more than 1 at % and equal to or less than 25 at % of Ga, is provided in contact with the n-type semiconductor layer 201 containing Ga. An impurity in a semiconductor diffuses in proportion to the concentration gradient, according to the Fick's law. In other words, atoms diffuse from a high-concentration region toward a low-concentration region in a solid. Accordingly, providing Ga in advance in the electrode allows preventing the diffusion of Ga from the semiconductor layer to the electrode. Adjusting the Ga content in the range of 1 at % to 25 at % enables forming the metal layer having the desired Ga content under accurate control, as well as properly decreasing the contact resistance of the electrode. Such arrangement enables, consequently, suppressing the deterioration in contact resistance originating from the operation of the device and thermal history.

The driving force of the impurity diffusion is the concentration gradient, more strictly the chemical potential gradient of the impurity with respect to the host substance. Accordingly, the diffusion of a specific impurity can be suppressed by providing the same substance in advance in a region where the impurity is supposed to diffuse. Thus, it is appropriate to provide Ga in the metal, in order to suppress the diffusion of Ga from the n-type semiconductor layer into the metal layer.

However, in case that the metal layer contains an excessive amount of Ga, the quality of the metal crystal is degraded, which leads to decline in conductivity and increase in contact resistance. The Ga content should therefore be restricted under a certain level.

Adjusting the Ga content of the metal layer 202 to be 25 at % or lower permits presence of a region solely occupied with the host metal in the metal bulk, thereby suppressing the contact resistance at a low level. It is undesirable to compose the entirety of the metal layer 202 from the compound containing the host metal and the Ga as component elements, because the properties become substantially different. Setting the upper limit of the Ga content at 25 at % allows preventing forming the entirety of the metal layer with the compound.

Figure 3:
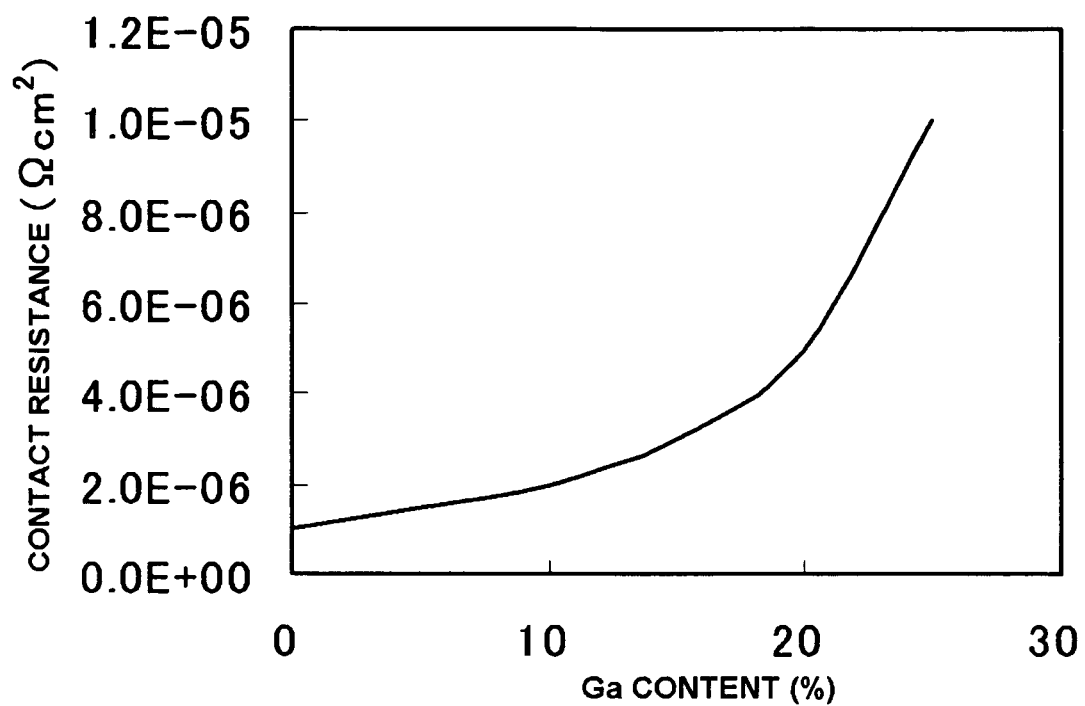
FIG. 3 is a graph for explaining the effect of the electrode according to the first embodiment.

FIG. 3 is a graph showing a simulative evaluation result of the relationship between the Ga content and the contact resistance based on the foregoing embodiment, on the assumption that the n-GaN layer is employed as the n-type semiconductor layer and the TiGa layer as the metal layer.

Whereas a contact resistance in the order of $10^{-5}$ $\Omega cm^2$ is said to be generally acceptable in the case of the n-side electrode, setting the Ga content to be 25 at % or lower enables achieving the contact resistance of $1.0 \times 10^{-5}$ $\Omega cm^2$ or lower, as shown in FIG. 3.

Although the melting point of Ga is approx. 30° C. and hence it is difficult to handle Ga at room temperature, the metal sintered compact constituted of a solid metal crystal with the Ga content not exceeding 25 at % can be a solid. This makes it possible to employ the RF sputtering process to form the metal layer on the n-type semiconductor layer. Also, the Ga content of 1 at % or more allows providing a desired amount of Ga in the metal layer by the RF sputtering process or co-deposition process under accurate control.

Further, with the conventional electrode, Ga in the substrate diffuses into the electrode through the alloying process. With the electrode according to this embodiment, however, the contact resistance can be suppressed at a low level despite executing the alloying process.

Second Embodiment

This embodiment represents a semiconductor laser that includes the n-side electrode according to the first embodiment. More particularly, an inner stripe GaN-based semiconductor laser shown in FIG. 4 will be referred to. Hereunder, description will be given on the structure and working of the semiconductor laser according to this embodiment.

Figure 4:
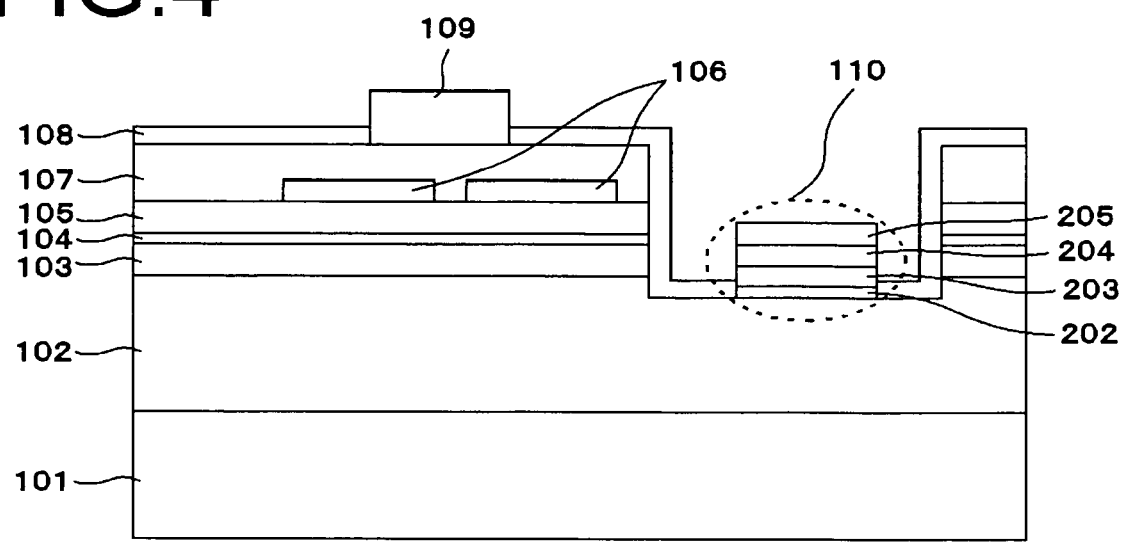
FIG. 4 is a cross-sectional view of a semiconductor laser according to a second embodiment.

FIG. 4 is a cross-sectional view showing a structure of the inner stripe semiconductor laser. The semiconductor laser of this embodiment includes a semiconductor layer structure and the metal electrode. Examples of the semiconductor layer structure include combinations of GaN, AlGaN, or InGaN. To be more detailed, the semiconductor layer structure includes an n-type substrate 101, an n-type clad layer 102, an n-type Separated Confinement Heterostructure (hereinafter, SCH) layer 103, an active layer 104, a p-type SCH layer 105, and a p-type Super Lattice Structure (hereinafter, SLS) layer 107, stacked in the mentioned order. On the p-type SLS layer 107, a p-side electrode 109 is provided. The n-side electrode 110 is located on the n-type clad layer 102 through the metal layer 202. The semiconductor laser according to this embodiment is covered with an insulating layer 108, such that the layers other than the n-type substrate 101, the n-side electrode 110 and the p-side electrode 109 are kept from being exposed.

The n-type substrate 101 may be, for example, an n-GaN substrate.

The n-type clad layer 102 serves to confine electric charge and light in the active layer 104. The n-type clad layer 102 also serves as the contact layer that attains a low contact resistance with the n-side electrode 110. The n-type clad layer 102 may be, for example, an n-AlGaN layer.

The active layer 104 is a quantum well active layer acting as a light emitting layer. The active layer 104 may be constituted of, for example, InGaN.

An n-type current block layer 106 is provided on the p-type SCH layer 105 for controlling the current route, and a lateral and upper faces are covered with the p-type SLS layer 107. The n-type current block layer 106 may be constituted of, for example, AlN.

The p-type SLS layer 107 also serves as the contact layer that attains a low contact resistance with the p-side electrode 109. The p-type SLS layer 107 may be constituted of, for example, GaN/AlGaN.

The insulating layer 108 may be, for example, a $SiO_2$ layer.

Figure 5:
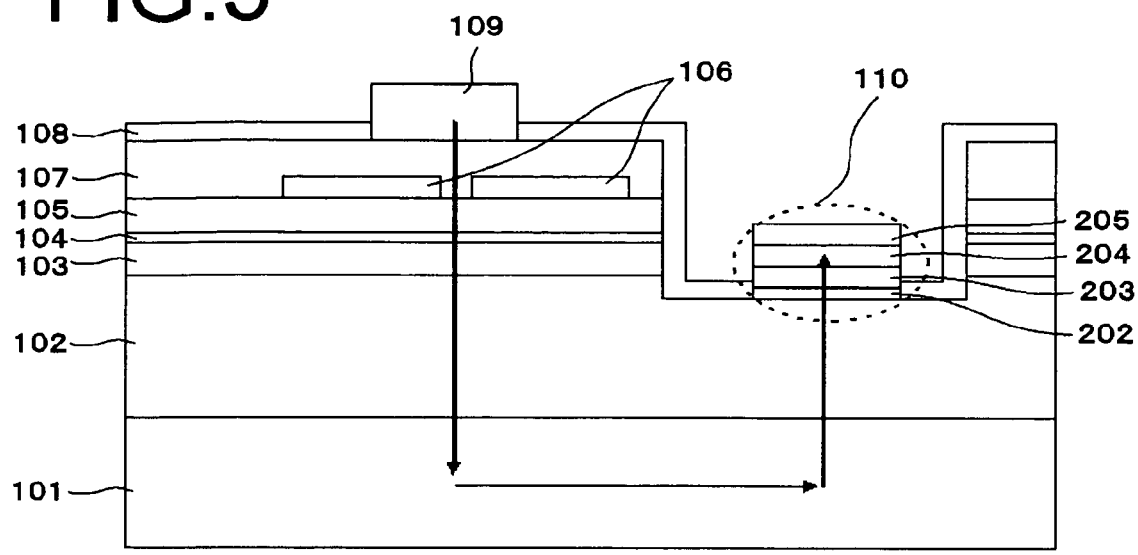
FIG. 5 is a cross-sectional view for explaining a working of the semiconductor laser according to the second embodiment.

FIG. 5 is a cross-sectional view for explaining the working of the semiconductor laser according to this embodiment. Arrows in FIG. 5 indicate the current route in an activated state. The current runs from the p-side electrode 109 to the n-side electrode 110, through the p-type SLS layer 107, the p-type SCH layer 105, the active layer 104, the n-type SCH layer 103, the n-type clad layer 102, and the n-type substrate 101.

Among the above, the material, composition, and thickness of the n-type substrate 101, the n-type clad layer 102, the n-type SCH layer 103, the active layer 104, the p-type SCH layer 105, and the p-type SLS layer 107 are associated with the magnitude of the electric resistance. These parameters are, however, under the restriction of controllability of optical distribution in the semiconductor laser, and hence cannot be freely determined so as to decrease the resistance. On the other hand, the material of the p-side electrode 109 and the n-side electrode 110 may be selected so as to reduce the contact resistance, irrespective of the optical distribution control.

The GaN-based semiconductor laser constituted of a combination of GaN, AlGaN, or InGaN may incur an increase in working voltage while the current is being supplied. A reason is that Ga from GaN diffuses in the metal electrode. The defect produced after the diffusion of Ga tends to form a hole and to act as a p-type dopant, and therefore the concentration of electrons which are the n-type carrier decreases at the interface between the semiconductor and the metal, so that the contact resistance increases. Also, as the number of defects increases, the void grows to thereby decrease the contact area between the metal and the semiconductor, which also encourages the resistance to increase.

In the semiconductor laser according to this embodiment, however, the metal layer 202 contains Ga. Accordingly, Ga already present in the metal layer 202 blocks the diffusion of Ga from the n-type clad layer 102 to the metal layer 202. Such structure prevents the deterioration of the contact resistance. The diffusion of Ga can also be driven by heat from a processing work or a plasma process, in addition to the current supply. Nevertheless, the foregoing structure of the semiconductor laser is effective against all such factors.

A sample of the GaN-based semiconductor laser was made up according to this embodiment, and observation was made on the deterioration in resistance due to operation of the device and thermal history. The voltages upon supplying a current of 200 mA were compared between before and after activating the laser for 1000 hours at a temperature of 80° C. and optical output of 250 mW. As a result, while the semiconductor laser not containing Ga in the metal layer 202 (host metal was Ti) presented an increase of more than 0.1 V, the one containing Ga presented an increase of less than 0.05 V. It has therefore proved that a superior suppressing effect of the contact resistance can be attained according to the latter, compared with the former.

Third Embodiment

This embodiment represents another semiconductor laser that includes the n-side electrode according to the first embodiment. More particularly, a ridge stripe semiconductor laser shown in FIG. 6 will be referred to. Hereunder, description will be given on the structure and working of the semiconductor laser according to this embodiment.

Figure 6:
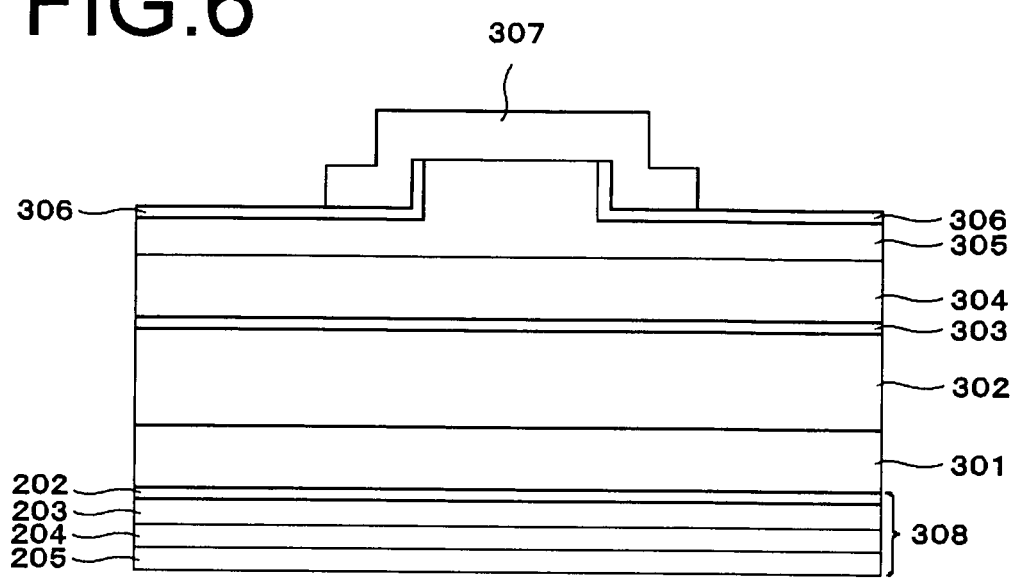
FIG. 6 is a cross-sectional view of a semiconductor laser according to a third embodiment.

FIG. 6 is a cross-sectional view showing a structure of the ridge stripe semiconductor laser. As shown therein, the ridge stripe GaN-based semiconductor laser includes a semiconductor layer structure and the metal electrode. Examples of the semiconductor layer structure may include combinations of GaN, AlGaN, or InGaN. To be more detailed, the semiconductor layer structure includes an n-type substrate 301, an n-type clad layer 302, an active layer 303, a p-type clad layer 304, a p-type SLS layer 305, and an insulating layer 306 stacked in the mentioned order. On the p-type SLS layer 305 a p-side electrode 307 is located so as to be in mutual contact. An n-side electrode 308 is provided on the back face of the n-type substrate 301.

The n-type substrate 301 may be, for example, an n-GaN substrate.

The n-type clad layer 302 serves to confine electric charge and light in the active layer 303. The n-type clad layer 302 also serves as the contact layer that attains a low contact resistance with the n-side electrode 308. The n-type clad layer 302 may be, for example, an n-AlGaN layer.

The active layer 303 is a quantum well active layer acting as a light emitting layer. The active layer 303 may be constituted of, for example, InGaN.

The p-type clad layer 304 serves to confine electric charge and light in the active layer 303. The p-type clad layer 304 may be, for example, a p-GaN/AlGaN layer.

The p-type SLS layer 305 also serves as the contact layer that attains a low contact resistance with the p-side electrode 307. The p-type SLS layer 305 may be constituted of, for example, GaN/AlGaN.

The insulating layer 306 may be, for example, a $SiO_2$ layer.

In the semiconductor laser according to this embodiment, the n-side electrode 308 is disposed in contact with the n-type substrate 301. In the manufacturing process of the semiconductor laser, the substrate is subjected to a mechanical or chemical polishing process to thereby be made thinner, before depositing the metal layer 202 of the n-side electrode 308 on the back of the substrate. Through this polishing process, the polished surface suffers damages and a number of crystalline defects are produced. Since the bonding force between the atoms constituting the crystal declines in the vicinity near the defect, Ga is more prone to diffuse from the n-type substrate 301 to the metal layer 202. In the semiconductor laser according to this embodiment, however, the metal layer 202 contains Ga. Accordingly, Ga already present in the metal layer 202 blocks the diffusion of Ga from the n-type substrate 301 to the metal layer 202. Such structure can suppress the diffusion of Ga more effectively.

Although the embodiments of the present invention have been described referring to the drawings, it is to be understood that those embodiments are merely exemplary, and that various other structures may be adopted. Also, although the present invention refers to upper and lower positions, this is merely for convenience sake for explicitly explaining the relationship between the constituents of the present invention, and such expression is not intended to determine a direction in a manufacturing process or in use, when executing the present invention.

In another exemplary embodiment, there is provided a method of manufacturing a semiconductor chip including preparing an n-type semiconductor layer that contains gallium (Ga);

forming an n-side electrode on a surface of said n-type semiconductor layer;

wherein said forming an n-side electrode includes:

depositing a Ga-containing metal layer on said surface of said n-type semiconductor layer; and employing a metal material having a Ga content of equal to or more than 1 at % and equal to or less than 25 at %, to thereby form said metal layer.

It is apparent that the present invention is not limited to the above embodiment, and may be modified and changed without departing from the scope and spirit of the invention.

What is claimed is:

1. A semiconductor laser, comprising:
    an n-side electrode to be formed on a surface of an n-type semiconductor layer that comprises gallium (Ga),
    wherein said n-side electrode comprises:
        a metal layer having a Ga content of equal to or more than 1 at% and equal to or less than 10 at%,
    wherein said metal layer is disposed in contact with said n-type semiconductor layer, and
    wherein a metal predominantly composing said metal layer is Ti.

2. The semiconductor laser according to claim 1, wherein said metal layer includes a metal material having a Ga content of equal to or more than 1 at% and equal to or less than 10 at%.

3. The semiconductor laser according to claim 1, wherein said n-type semiconductor layer includes a III-V compound.

4. The semiconductor laser according to claim 1, wherein said metal predominantly composing said metal layer has a work function of equal to or less than 5 eV.

5. The semiconductor laser according to claim 1, wherein said n-type semiconductor layer is an n-type nitride semiconductor layer.

6. The semiconductor laser according to claim 1, wherein said n-side electrode further comprises a gold-plating layer disposed above the metal layer.

7. The semiconductor laser according to claim 6, wherein said n-side electrode further comprises a barrier layer disposed between the gold-plating layer and the metal layer.

8. The semiconductor laser according to claim 6, wherein said n-side electrode further comprises a gold layer and a platinum layer disposed between the gold-plating layer and the metal layer.

9. The semiconductor laser according to claim 1, wherein said n-type semiconductor layer comprises $Ti_3Ga$ or $Ti_2Ga$.

10. A recording and reproducing apparatus, comprising a semiconductor laser according to claim 1.

11. The semiconductor laser according to claim 1, wherein a thickness of the metal layer is 100 Å or more.

* * * * *